United States Patent
Backus et al.

(10) Patent No.: US 8,976,821 B2
(45) Date of Patent: Mar. 10, 2015

(54) ANISOTROPIC BEAM PUMPING OF A KERR LENS MODELOCKED LASER

(71) Applicant: KM Labs Inc., Boulder, CO (US)

(72) Inventors: Sterling Backus, Erie, CO (US); Charles G. Durfee, Golden, CO (US); Matthew S. Kirchner, Westminster, CO (US)

(73) Assignee: KM Labs Inc., Boulder, CO (US)

( * ) Notice: Subject to any disclaimer, the term of this patent is extended or adjusted under 35 U.S.C. 154(b) by 0 days.

(21) Appl. No.: 14/137,631

(22) Filed: Dec. 20, 2013

(65) Prior Publication Data

US 2014/0219297 A1  Aug. 7, 2014

Related U.S. Application Data

(60) Provisional application No. 61/740,383, filed on Dec. 20, 2012.

(51) Int. Cl.
*H01S 3/098* (2006.01)
*H01S 3/08* (2006.01)

(52) U.S. Cl.
CPC .................... *H01S 3/08018* (2013.01)
USPC ............................... 372/18; 372/41

(58) Field of Classification Search
CPC ....... H01S 3/1112; H01S 3/1106; H01S 3/11; H01S 3/1636
USPC ..................................... 372/18, 41
See application file for complete search history.

(56) References Cited

U.S. PATENT DOCUMENTS

| | | | |
|---|---|---|---|
| 5,079,772 A | 1/1992 | Negus et al. | |
| 5,097,471 A | 3/1992 | Negus et al. | |
| 5,799,025 A | 8/1998 | Lai et al. | |
| 5,966,390 A | 10/1999 | Stingl et al. | |
| 8,130,800 B2 * | 3/2012 | Holtom | 372/11 |
| 2003/0118060 A1 * | 6/2003 | Spuehler et al. | 372/18 |

OTHER PUBLICATIONS

Asaki et al., "Generation of 11-fs pulses from a self-mode-locked Ti:sapphire laser", Optics Letters, Jun. 15, 1993, vol. 18, No. 12, pp. 977-979.
Roth et al., "Directly diode-laser-pumped Ti:sapphire laser", Optics Letters, Nov. 1, 2009, vol. 34, No. 21, pp. 3334-3336.
Roth et al., "Direct diode-laser pumping of a mode-locked Ti:sapphire laser", Optics Letters, Jan. 15, 2011, vol. 36, No. 2, pp. 304-306.
Muller et al., "Frequency-doubled DBR-tapered diode laser for direct pumping of Ti:sapphire lasers generating sub-20 fs pulses", Optics Express, Jun. 8, 2011, vol. 19, No. 13, pp. 12156-12163.

* cited by examiner

*Primary Examiner* — Kinam Park
(74) *Attorney, Agent, or Firm* — Jennifer L. Bales; Macheledt Bales LLP (57) ABSTRACT

Apparatus and methods for anisotropic pumping of a Kerr lens modelocked laser. Direct diode laser pumping of an ultrafast Kerr lens modelocked laser oscillator is accomplished. Diode lasers generate severely anisotropic beams, meaning the pump beam has a higher-beam-quality dimension and a lower-beam-quality dimension. By spatially overlap of the pump beam higher-beam-quality dimension and the KLM laser mode, KLM operation is accomplished. Multiple laser diode pump beams are combined in counterpropagating and same-side configurations.

18 Claims, 6 Drawing Sheets

——— Pump beam
------- Cavity mode

—— Pump beam
----- Cavity mode

ANISOTROPIC BEAM PUMPING OF A KERR LENS MODELOCKED LASER

BACKGROUND OF THE INVENTION

1. Field of the Invention

The present invention relates to anisotropic beam pumping of a Kerr lens modelocked laser. In particular, the present invention relates to using direct diode laser pumping of an ultrafast Kerr lens modelocked laser oscillator.

2. Description of Related Art

Ultrafast (i.e. pulsewidth of about 100 fs or less) lasers are used for many purposes, including seed sources for amplifiers and light sources for scientific equipment. Laser oscillators can be thought of having two main sub-modules: the pump source and the laser oscillator cavity. The pump source serves as the optical power source for the oscillator; it converts electrical power into optical power in a form that can be used to generate the desired laser output. The purpose of the laser oscillator cavity is to convert the power from the pump source into the desired optical characteristics for the given application.

Figure 1A:
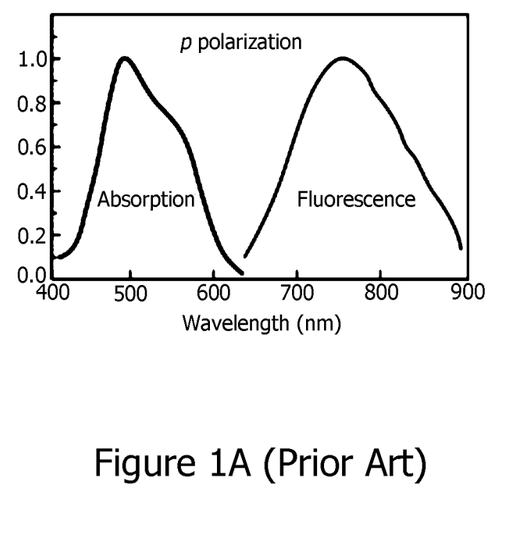
FIG. 1A (Prior Art) shows a Ti:sapphire absorption curve.

Historically, Ti:sapphire has been the laser crystal of choice for ultrafast laser oscillators because of its durability, wide bandwidth, pumping ease, and commercial availability. In order for the pump source light to be converted to oscillator light, it must be absorbed by the Ti:sapphire; FIG. 1 (Prior Art) shows this absorption curve 102, as well as the fluorescence curve 104. As can be seen, the peak absorption is around 500 nm but extends from about 450 nm to 600 nm.

Initially, the Argon Ion laser was used to pump Ti:sapphire because of its emission near the absorption peak and excellent beam quality; however, the bulky, expensive, high-maintenance nature of this gas laser quickly gave way to solid state, frequency-doubled lasers such as Nd:YAG and Nd:YLF. Over the years, these solid state lasers have increased in reliability and power while decreasing in cost. However, these pump lasers all share the same complex architecture: laser diodes convert electrical power to optical power; a laser cavity produces infra-red light; and frequency-doubling crystal converts the infra-red light to a wavelength which can be absorbed by Ti:Sapphire. Inherent in this pump laser design was the assumption that the pump laser must have excellent beam quality (quantified by the $M^2$ parameter being $<\sim1.5$ (also called 'diffraction limited')) in order to achieve Kerr Lens Modelocking (KLM), the process responsible for creating the ultrashort pulses. (See, for example, Roth et al., "Directly diode-laser-pumped Ti:sapphire laser," Opt Lett 34 3334-3336 (2009)).

Specific alternatives to the present invention include pumping ultrafast oscillators with anything that produces high beam quality in both axes such as solid-state, frequency-doubled lasers (for example those produced by Lighthouse Photonics), optically pumped semiconductor lasers (OPSELs), and gas lasers, such as those produced by Coherent Inc.

Indirect diode pumping of ultrafast oscillators using a frequency-doubled distributed Bragg reflector (DBR) tapered laser diode requires complex and expensive components to create a high beam quality output from a low beam quality laser diode source at a different fundamental wavelength.

Direct-diode pumping of ultrafast oscillators has been demonstrated before, however, these implementations either required a saturable media, such as a saturable Bragg reflector (SBR), or were accomplished with a fiber-coupled diode laser with high beam quality in both dimensions. The implementations that require a saturable Bragg reflector (SBR) for modelocking use the saturable reflection of the SBR rather than the nearly instantaneous Kerr Lens effect to implement modelocking. The advantages of Kerr Lens Modelocking over Saturable Absorbers and Saturable Reflectors are a reduction in component complexity, shorter fundamental pulse durations, and an increase in reliability. Saturable media are notorious for burning. The implementations of direct-diode pumping an ultrafast oscillator with a high beam quality in both dimensions demonstrate Kerr Lens Modelocking (P. Wasylczyk, P. Wnuk, and C. Radzewicz, "Passively modelocked, diode-pumped Yb:KYW femtosecond oscillator with 1 GHz repetition rate," Opt. Express 17, 5630-5635 (2009).), but high beam quality fiber-coupled diodes of sufficient output power are not available at the correct wavelengths for pumping many gain media in which Kerr Lens Modelocking is advantageous, specifically Ti:sapphire. Therefore, this invention enables Kerr Lens Modelocking of ultrafast oscillators that use gain media where powerful, high beam quality diodes are not available for use as a pump laser, but where powerful diodes are available for use as a pump laser that have good beam quality in one axis but not the other.

Other alternatives include Kerr Lens Mode locked Ti:sapphire lasers and Semiconductor Saturable Absorber Mirror (SESAM) mode locked Ti:Sapphire lasers.

A need remains in the art for a laser pump scheme using anisotropic pumping of a Kerr lens modelocked laser.

SUMMARY

It is an object of the present invention to provide a laser pump scheme using anisotropic pumping of a Kerr lens modelocked laser. In particular, the present invention uses direct diode laser pumping of an ultrafast Kerr lens modelocked laser oscillator, for example a Ti:sapphire laser.

Thus, in embodiments of the present invention, the pump source consists only of laser diodes which convert the electrical power directly into optical pump power at a wavelength which can be absorbed by Ti:Sapphire. These pump beams typically are anisotropic, meaning that they have a higher beam quality in one dimension than in the other.

A direct laser diode pumped, Kerr lens modelocked, laser comprises a diode pump laser that generates an anisotropic pump beam having a higher-beam-quality dimension and a lower-beam-quality dimension, an oscillator cavity including a gain medium, and optics for directly coupling the pump beam into the gain medium without frequency doubling or the like. The various elements are constructed and arranged such that when the laser is modelocked, spatial overlap of the pump beam higher-beam-quality dimension and the KLM laser mode is improved, over spatial overlap of the pump beam higher-beam-quality dimension and the continuous wave mode. The gain medium might comprise a Ti:sapphire crystal, and the diode laser might have center frequencies on the low end of the absorption curve of Ti:sapphire, for example blue to violet. Generally the pump beam quality number is $M^2=1.1$ or worse in the higher-beam-quality dimension and $M^2=3$ or worse in the lower-beam-quality dimension. Generally the $M^2$ quality of the lower-beam-quality dimension is at least about three times the $M^2$ quality of the higher-beam-quality dimension.

In some embodiments, two diode pump lasers are configured side-by-side, and the optics couple both pump beams into the gain medium in the same direction. The beams might approach the gain medium side-by-side and overlap within the gain medium, or they might be spectrally combined within the gain medium. Some configurations include optics to synchronize a slow axis of the pump beam with a fast axis of the pump beam. In general, the spatial overlap of the pump beam higher-beam-quality dimension and the KLM laser mode is improved by at least two times over continuous wave mode.

Thus, a Kerr lens modelocked, ultrafast laser includes a pump beam generator for generating an anisotropic pump beam, an oscillator cavity including a gain medium, and optics for coupling the pump beam into the gain medium and the elements constructed and arranged such that when the laser is modelocked, spatial overlap of the pump beam higher-beam-quality dimension and the KLM laser mode is improved, over continuous wave mode. Again, a second beam might be added to pump the laser in various configurations. In some case the laser is direct diode laser pumped.

A method of inducing stable Kerr lens modelocking in an ultrafast laser includes the steps of generating one or more anisotropic pump beam, the pump beam having a higher-beam-quality dimension and a lower-beam-quality dimension, wherein the $M^2$ quality of the lower-beam-quality dimension is at least about three times the $M^2$ quality of the higher-beam-quality dimension, constructing and arranging the laser elements such that when the laser is modelocked, spatial overlap of the pump beam higher-beam-quality dimension and the KLM laser mode is improved, over continuous wave mode, Kerr lens modelocking the ultrafast laser, and outputting ultrafast pulses.

Finally, a method of inducing stable Kerr lens modelocking in an ultrafast laser comprising the steps of generating a two pump beams and focusing them into a gain medium through the same side of the gain medium, such that the pump beams overlap in one beam dimension throughout the gain medium, constructing and arranging the elements of the laser such that when the laser is modelocked, spatial overlap of the pump beams in the overlap dimension and the KLM laser mode is improved, over continuous wave mode, Kerr lens modelocking the ultrafast laser, and outputting ultrafast pulses.

Those skilled in the art of Kerr lens modelocking will appreciate that many other embodiments fall within the spirit of the present invention.

DETAILED DESCRIPTION OF THE PREFERRED EMBODIMENTS

The table below provides reference numbers and associate elements for convenience in discussion the example embodiments of present invention shown in the figures and discussed below. Note that none of the figures is to scale.

| Ref. No. | Element |
|---|---|
| 102 | Absorption - Ti-Sapphire |
| 104 | Fluorescence - Ti-Sapphire |
| 200 | Dual end-pumping embodiment |
| 202 | Diode laser |
| 204 | Aspheric lens |
| 206 | Cylindrical telescope |
| 208 | Lens |
| 210 | Laser cavity |
| 212 | Dichroic curved mirror |
| 214 | Dichroic curved mirror |
| 216 | Ti-Sapphire crystal |
| 218 | Output coupler |
| 220 | Output |
| 222 | Prism |
| 224 | Mirror |
| 226 | Prism |
| 228 | Mirror |
| 300 | Second embodiment |
| 302 | Mirror |
| 304 | Mirror |
| 306 | Mirror |
| 308 | Lens |
| 310 | Mirror |
| 314 | Curved mirror |
| 400 | Third embodiment |
| 412 | Curved mirror |
| 413 | Spectral combination optics |

As used herein, the term "direct diode laser pumping" means diode lasers provide the pump beams to the cavity directly, via only linear optical elements such as lenses, mirrors, and/or beam splitters/combiners, without the need for frequency doubling or other nonlinear elements. Note that terms such as vertical and horizontal are used for clarity in understanding the figures, but do not limit the configuration of the embodiments.

FIGS. 1B-1I are diagrams illustrating continuous wave versus Kerr lens modelocking (KLM) for various configurations of the present invention. KLM is only stable if the KLM mode is considerably more efficient than the continuous wave (CW) mode. This generally occurs when the spatial overlap of the pump beam and the KLM laser mode better than the spatial overlap of the pump beam and the CW mode. The present invention is based upon the discovery that it is possible to induce stable KLM with an anisotropic beam so long as the spatial overlap of the pump beam higher-beam-quality dimension and the KLM laser mode better than the spatial overlap of the pump beam and the CW mode. It is not necessary that the spatial overlap of the higher-beam-quality dimension is good. KLM has been accomplished with beam quality differences of three times or more between the dimensions.

One important advantage of the present invention is that KLM in Ti:sapphire lasers is accomplished with an anisotropic beam such as that generated by currently available 1.0 W, 445 nm diode lasers. The pump beams typically have an $M^2$ in the x-direction of about 1.3 and an $M^2$ in the y-direction of 3-4—well below the $M^2$ of under 1.1 in both dimension typically required to accomplish KLM in Ti:sapphire lasers.

Figure 1B:
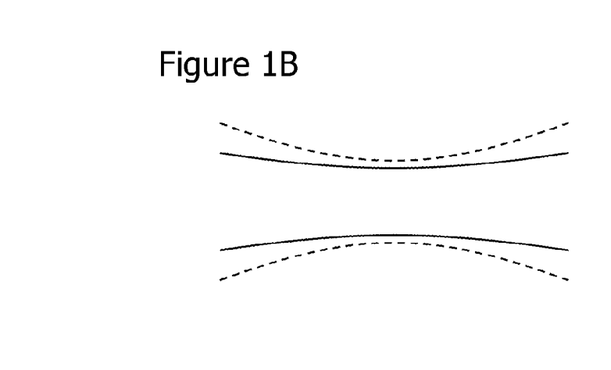
FIGS. 1B-1I are diagrams illustrating continuous wave versus Kerr lens modelocking (KLM) for various configurations of the present invention.
Figure 1C:
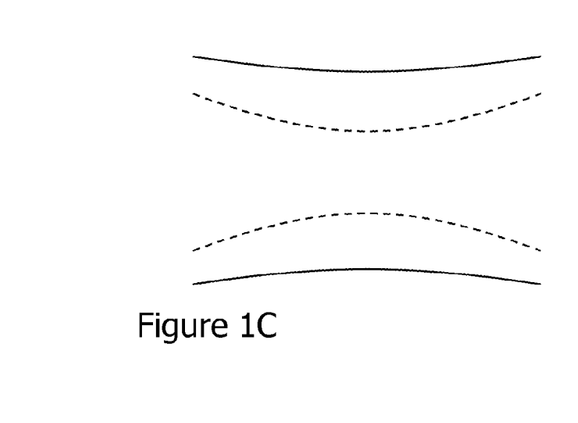

FIGS. 1B-1E illustrate both single beam pumping and spectral-combined beam pumping configurations. FIGS. 1B and 1C show the spatial overlap of the pump beam and the CW cavity mode, for the higher-beam-quality dimension and the higher-beam-quality dimension, respectively. CW is easily accomplished, but the overlap is only fair.

Figure 1D:
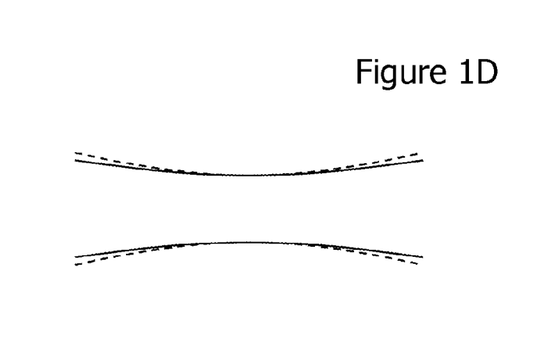
Figure 1E:
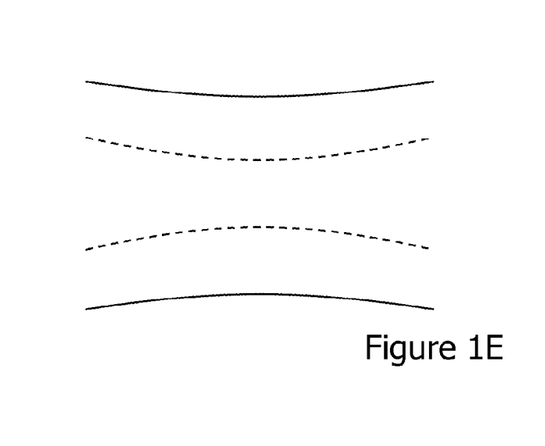

FIGS. 1D and 1E show the spatial overlap of the pump beam and the KML cavity mode, for the higher-beam-quality dimension and the lower-beam-quality dimension, respectively. The overlap between the KLM mode and the higherbeam-quality dimension is substantially better than the overlap between the mode and the higher-beam-quality dimension, but the overlap between the KLM mode and the lower-beam-quality dimension is very poor, and far below what was previously thought to be sufficient for KLM operation. Yet the KLM power has been found to exceed the CW power by a factor of 1.5 to 10, producing strong, stable KLM operation.

Although the absorption of 445 nm pump light is significantly lower than the absorption of the 532 nm light typically used in in Ti:sapphire lasers (see FIG. 1, A Prior Art), it works well for the present purpose. The gain region is more uniformly distributed throughout the length of crystal 216. In addition, 445 nm light intrinsically focuses to a tighter spot than 532 nm light.

Figure 3:
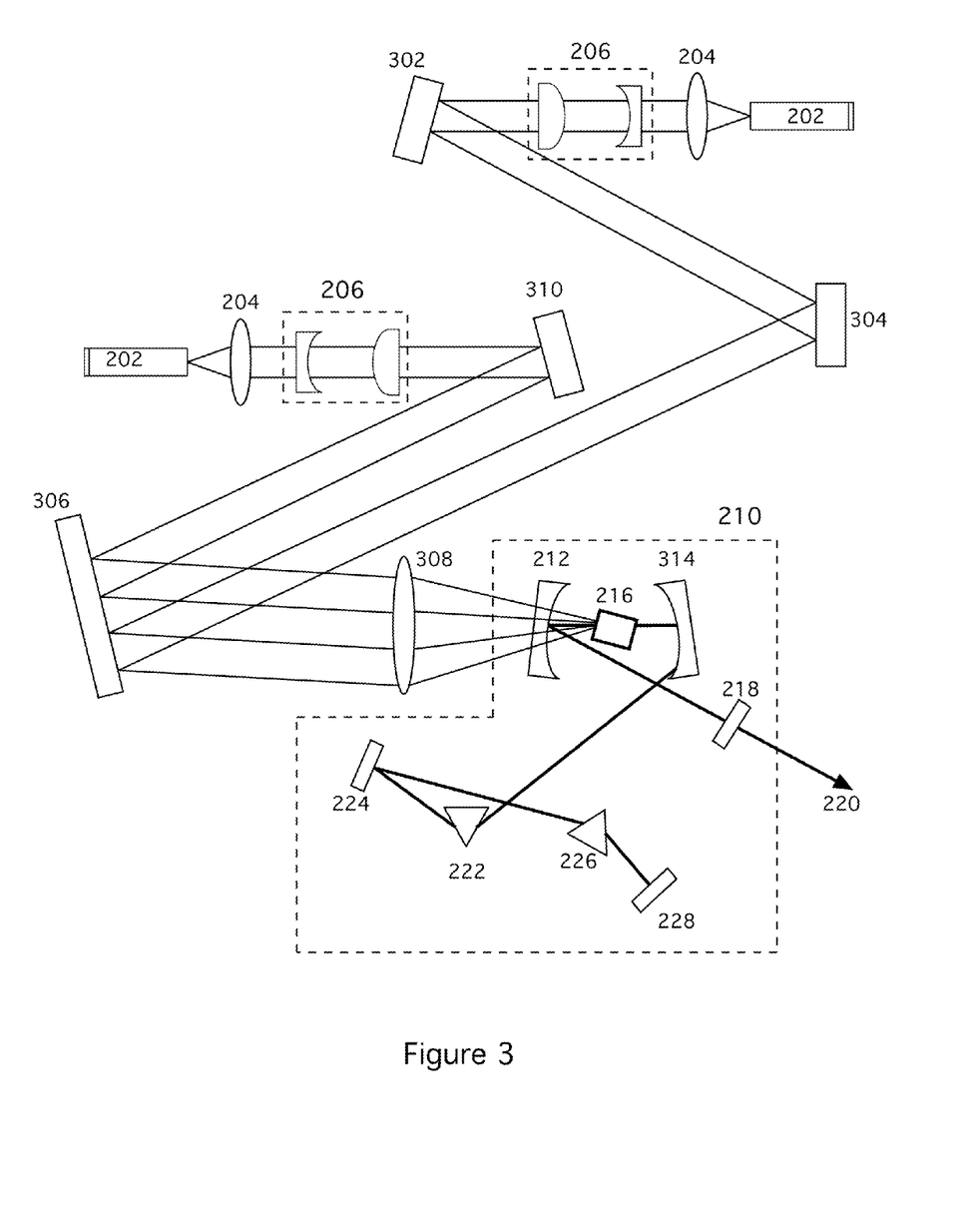
FIG. 3 is a block diagram showing a second laser embodiment using same-side diode lasers and side-by-side pump beams.
Figure 4:
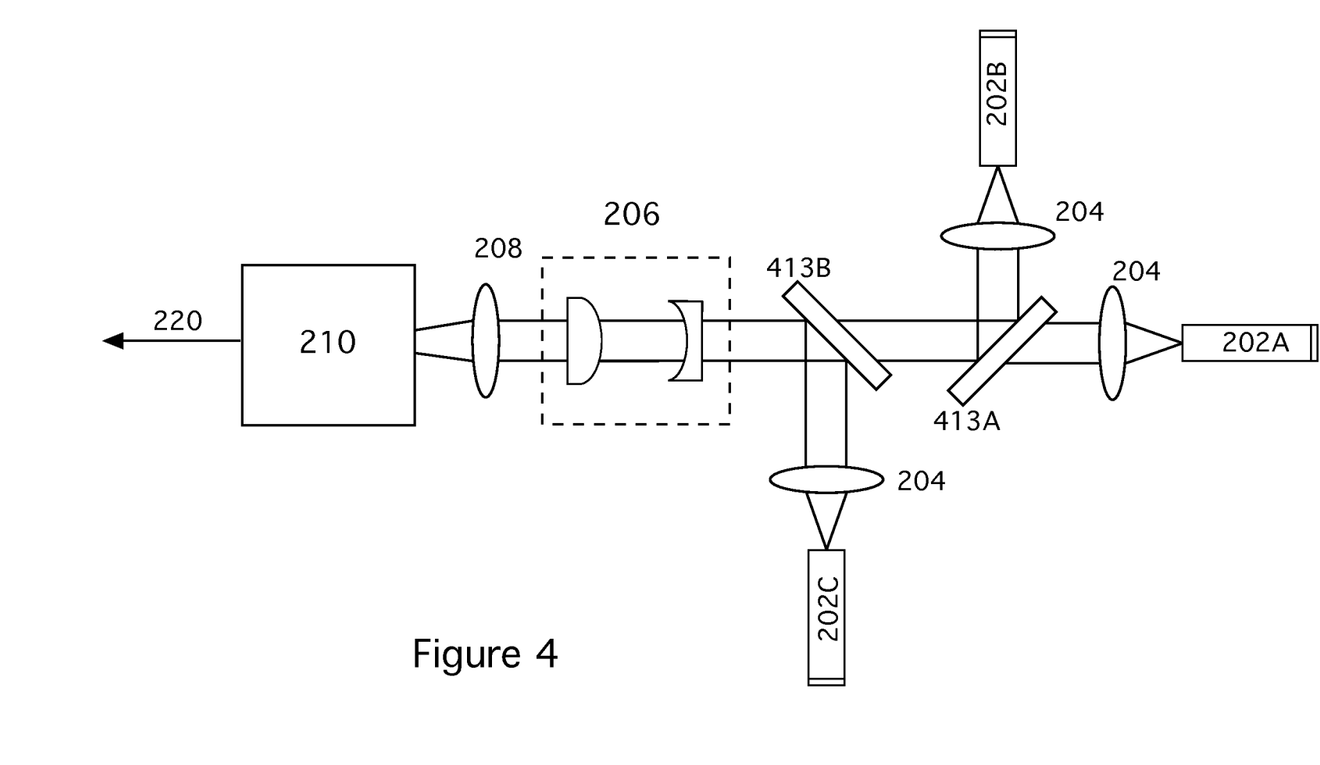
FIG. 4 is a block diagram showing a third laser embodiment using same-side diode lasers and spectral-combined pump beams.

Another advantage of the present invention is that it allows two or more diode lasers to be used for pumping, both in counter-propagating embodiments (see FIG. 2), in side-by-side, non-collinear embodiments (see FIG. 3) and in same-side spectrally combined embodiments (see FIG. 4). FIGS. 1F-1I show the spatial overlap of two pump beams and the KML cavity mode, for the higher-beam-quality dimensions and the lower-beam-quality dimensions, respectively.

Figure 1F:
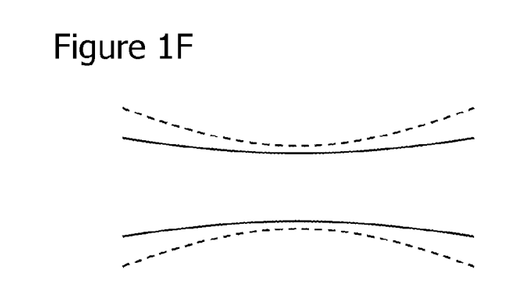
Figure 1G:
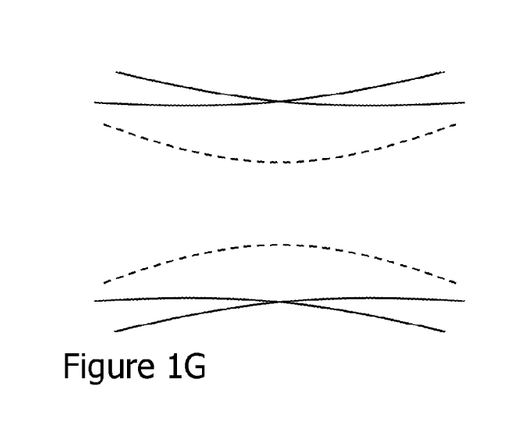
Figure 1H:
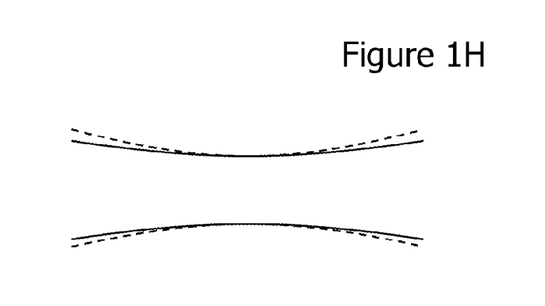
Figure 1I:
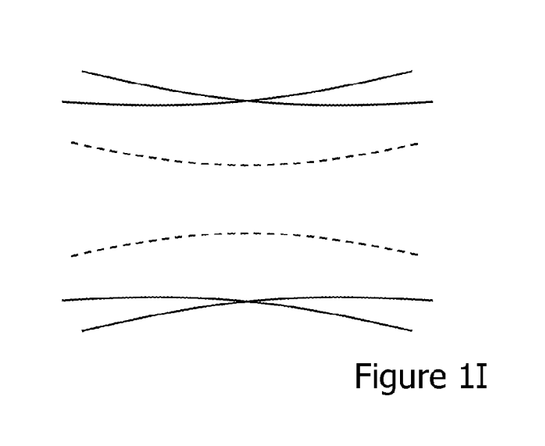

Regarding the side-by-side configurations, the inventors have discovered that the very asymmetric focal spot shape of the 445 nm pump beam allows for considerable flexibility in pumping configurations. For example, as shown in FIG. 3, the beams of two such diode lasers 202 are collimated and placed side-by-side to enter the lens that focuses the light into Ti:sapphire crystal 216. The beams thus cross in the laser crystal in an "x" in the horizontal direction. This would effectively broaden the gain region in this x direction—except that this is the dimension where the beam focal spot size is relatively large anyway. In the vertical direction, the two beam focal spots can overlap throughout the propagation through the crystal. FIGS. 1F and 1G illustrate that the overlap between the KLM mode and the higher-beam-quality dimension is substantially better than the overlap between the mode and the higher-beam-quality dimension. FIGS. 1G and 1I show the lower-beam-quality-dimension crossing, meaning the overlap is even worse for this dimension. Stable KLM operation is still achieved because of the excellent overlap between the KLM mode and the higher-beam-quality dimension.

Thus, embodiments of the present invention take advantage of the asymmetric focal spot to allow two pump laser beams to enter side-by-side from the same side of the crystal. This is new. To the inventors' knowledge, no KLM lasers have successfully employed two pump beams entering from the same side of the crystal. This allows using more than one pump laser in a way that avoids light from one pump diode from entering into the other.

Figure 2:
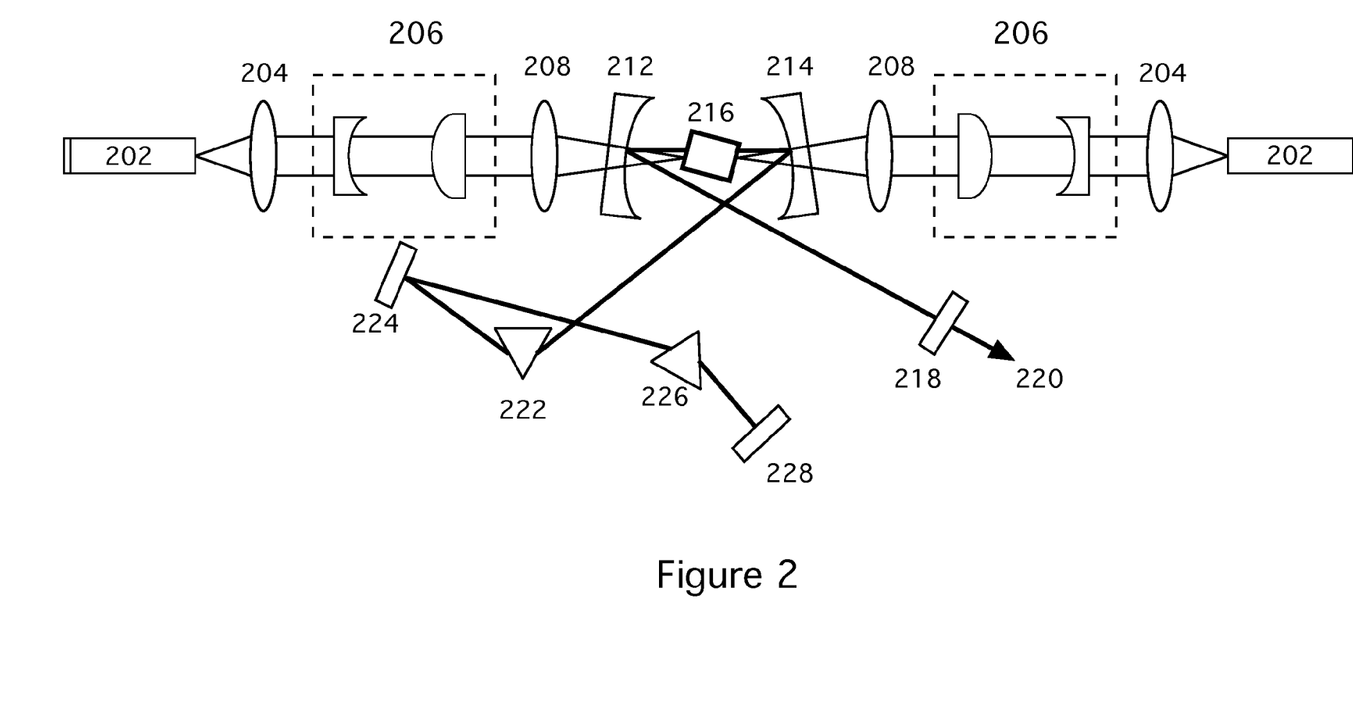
FIG. 2 is a schematic diagram showing a first embodiment of a laser with direct diode pumping using counter-propagating pump beams.

FIG. 2 is a schematic diagram showing a first embodiment of a laser 200 with direct diode pumping using dual-end pumping. Ti:sapphire lasers are well understood in the field of ultrafast lasers, and in most respects, the following embodiments are conventional Ti:sapphire lasers, as described (for example) in the seminal paper "Generation of 11-fs pulses from a self-mode-locked Ti-Saphire laser", Asaki et al., Optics Letters, Jun. 15, 1993, Vol. 18, No. 12. A currently available example of such a laser is the KMLabs Griffin™. Embodiments of the present invention have been modified to run at low pumping thresholds by using slightly shorter focal length curved mirrors 212, 214 (86 mm radius of curvature rather than the more typical 100 mm radius of curvature) as well as a 1% output coupling mirror 218 centered at 800 nm.

The laser 200 of FIG. 2 is pumped by two 1.2 W, 445 nm laser diodes 202, each of which is collimated by a 6 mm aspheric lens 204. Diode lasers 202 have an emitter area of approximately 15 um×1 um. Diode lasers 202 are polarized along the long axis of the diode output facet. For both diodes, this long facet axis is oriented in the horizontal (x) direction, such that the beam diverges faster in the vertical (y) direction. To avoid pushing the diode lasers to their rated limit, the laser diodes are operated at 1 W each, with 1.8 W delivered through all optics to crystal 216.

In this embodiment, each diode laser 202 is collimated by an aspheric lens 204 followed by a 3:1 cylindrical telescope 206 applied to the slow axis. In this example, the fast and slow axes of the diode beam, when collimated only with the aspheric lens 204, focus to different planes, so the cylindrical telescope 206 is adjusted to place the two beam waists at the same plane and to decrease the spot size of the slow axis beam dimension in the crystal.

The pump beams are linearly polarized, and thermoelectrically (TEC) cooled (not shown) to control the center wavelength and to stabilize the output power. As an alternative, other methods of cooling such as water or cryogenic cooling may be used, or cooling may not be necessary.

The pump beams are focused with 50 mm lenses 208 onto Ti:sapphire crystal 216 from both sides ("dual end-pumping"). Crystal 216 is a 4.75 mm thick Brewster angle Ti:sapphire crystal with an absorption coefficient of 2 cm-1 at 445 nm, giving 60% absorption of the pump light in this example.

The intracavity prisms 222, 226 for dispersion compensation are fused silica, and are 650 mm apart (path length). The output coupler 218 is 1% at 800 nm. Detuning of the pump light wavelengths helps reduce feedback from one diode into the other.

The oscillator 210 uses a pair of 86 mm radius of curvature (ROC) dichroic mirrors 212, 214 surrounding a Brewster angle 4.75 mm thick Ti:sapphire crystal 216 with an absorption coefficient of 2 cm$^{-1}$ at 445 nm, giving 60% absorption of the pump light. The crystal has a figure of merit greater than 200. KLM may be initiated in a number of ways, such as by rapidly moving on the prisms in order to generate an intensity spike.

This embodiment has been shown to achieve stable Kerr lens modelocking with a 21 nm spectrum, and an output power of 44 mW. Pulses with 15 fs duration were also achieved. The CW power is lower than the KLM power by a factor of three, indicating a strong preference for KLM and high long-term stability.

FIG. 3 and FIG. 4 are embodiments of the present invention using combined same-side pump beams from diode lasers 202.

FIG. 3 is a block diagram showing a laser embodiment using same-side pump beams, wherein the pump beams enter crystal 216 side-by-side. This is accomplished using mirrors 302, 304, 306 as shown in the figure. Lens 308 focuses the side-by-side beams into crystal 216, where they, in combination cause KLM. Referring back to FIGS. 1H and 1I is useful in visualizing the KLM operation of this embodiment. The beams are not precisely collinear, but overlap well in the higher-beam-quality dimension.

FIG. 4 is a block diagram showing a third laser embodiment using multiple same-side pump diode lasers 202 and spatially-overlapped spectrally-combined pump beams. This is accomplished with the use of spectral combination optics 413A, 4136, etc. Diode lasers 202A, 202B, 202C, etc. are selected to generate pump beams with slightly different center frequencies. This allows the pump beam from laser 202A to pass through spectral combination optic 413A, while the pump beam from diode laser 202B reflects off of spectral combination optic 413A. Similarly, the pump beams from diode lasers 202A and 202B pass through spectral combination optic 4136, while the pump beam from diode laser 202C reflect off of spectral combination optic 4136 to combine with the pump beams from diode lasers 202A and 202B. Telescope lens 206 adjusts the fast and slow axes of all three pump beams, and lens 208 focuses them into the laser cavity 210, which operates as previously shown to generate output beam 220. The present inventors have accomplished the combination of three pump beams so far, and those skilled in the art of ultrafast lasers will appreciate how the design is modified to combine more pump beams. This embodiment of the invention has demonstrated more than 300 mW modelocked output power and output spectra of more than 140 nm full-width-half-maximum, which supports pulse durations of less than 10 fs.

While the exemplary preferred embodiments of the present invention are described herein with particularity, those skilled in the art will appreciate various changes, additions, and applications other than those specifically mentioned, which are within the spirit of this invention. For example, while the present invention is particularly useful in accomplishing Kerr lens modelocking with blue light diode lasers in Ti:sappire crystals, the technique is also useful in inducing KLM in other oscillators and/or with other anisotropic pump beam sources.

What is claimed is:

1. A direct laser diode pumped, Kerr lens modelocked, laser comprising:
    a diode pump laser that generates an anisotropic pump beam, the pump beam having a higher-beam-quality dimension and a lower-beam-quality dimension;
    an oscillator cavity including a gain medium; and
    optics for directly coupling the pump beam into the gain medium;
    the elements constructed and arranged such that when the laser is modelocked, spatial overlap of the pump beam higher-beam-quality dimension and the KLM laser mode is improved, over spatial overlap of the pump beam higher-beam-quality dimension and the continuous wave mode.

2. The laser of claim 1 wherein the gain medium is a Ti:sapphire crystal.

3. The laser of claim 2 wherein the pump beam wavelength is below the full width at half maximum point of the absorption curve of the Ti:sapphire crystal.

4. The laser of claim 3 wherein the diode pump laser generates blue-to-violet light and produces a pump beam of at least about $M^2=1.1$ in the higher-beam-quality dimension and at least about $M^2=3$ in the lower-beam-quality dimension.

5. The laser of claim 1 wherein the $M^2$ quality of the lower-beam-quality dimension is at least about three times the $M^2$ quality of the higher-beam-quality dimension.

6. The laser of claim 1 including two diode pump lasers configured side-by-side, wherein the optics couple both pump beams into the gain medium in the same direction.

7. The laser of claim 6 wherein the pump lasers are configured such that the beams approach the gain medium side-by-side and overlap within the gain medium.

8. The laser of claim 1 including two diode pump lasers spectrally combined within the gain medium.

9. The laser of claim 1 further including optics to synchronize a slow axis of the pump beam with a fast axis of the pump beam.

10. The laser of claim 1 wherein the spatial overlap of the pump beam higher-beam-quality dimension and the KLM laser mode is improved by at least about two times over continuous wave mode.

11. A Kerr lens modelocked, ultrafast laser comprising:
    a pump beam generator for generating an anisotropic pump beam, the pump beam having a higher-beam-quality dimension and a lower-beam-quality dimension;
    an oscillator cavity including a gain medium; and
    optics for coupling the pump beam into the gain medium;
    the elements constructed and arranged such that when the laser is modelocked, spatial overlap of the pump beam higher-beam-quality dimension and the KLM laser mode is improved, over continuous wave mode.

12. The laser of claim 11 further comprising a second pump beam generator for generating a second anisotropic pump beam, the second pump beam having a higher-beam-quality dimension and a lower-beam-quality dimension.

13. The laser of claim 12 wherein the coupling optics couple both pump beams into the same end of the gain medium.

14. The laser of claim 13 wherein the wherein the pump lasers are configured such that the beams approach the gain medium side-by-side and overlap within the gain medium.

15. The laser of claim 14 wherein the pump beam generators comprise diode lasers and wherein the coupling optics comprise linear optical elements.

16. The method of inducing stable Kerr lens modelocking in an ultrafast laser comprising the steps of:
    (a) generating an anisotropic pump beam, the pump beam having a higher-beam-quality dimension and a lower-beam-quality dimension, wherein the $M^2$ quality of the lower-beam-quality dimension is at least about three times the $M^2$ quality of the higher-beam-quality dimension;
    (b) coupling the pump beam into a gain medium of the laser;
    (c) constructing and arranging the laser elements such that when the laser is modelocked, spatial overlap of the pump beam higher-beam-quality dimension and the KLM laser mode is improved, over continuous wave mode;
    (d) Kerr lens modelocking the ultrafast laser; and
    (e) outputting ultrafast pulses.

17. The method of claim 16, wherein step (a) generates two anisotropic beams, and wherein step (b) couples both beams into the gain medium.

18. The method of inducing stable Kerr lens modelocking in an ultrafast laser comprising the steps of:
    (a) generating a first pump beam;
    (b) generating a second pump beam;
    (c) focusing both pump beams into a gain medium through the same side of the gain medium, such that the pump beams substantially overlap in one beam dimension substantially throughout the gain medium;
    (d) constructing and arranging the elements of the laser such that when the laser is modelocked, spatial overlap of the pump beams in the overlap dimension and the KLM laser mode is improved, over continuous wave mode;
    (c) Kerr lens modelocking the ultrafast laser; and
    (d) outputting ultrafast pulses.

* * * * *